United States Patent
Guenther et al.

(10) Patent No.: US 8,065,789 B2
(45) Date of Patent: Nov. 29, 2011

(54) METHOD OF FABRICATING A HEATED SUBSTRATE SUPPORT

(75) Inventors: Rolf A. Guenther, Monte Sereno, CA (US); Curtis B. Hammill, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 484 days.

(21) Appl. No.: 12/178,228

(22) Filed: Jul. 23, 2008

(65) Prior Publication Data
US 2008/0271309 A1 Nov. 6, 2008

Related U.S. Application Data

(63) Continuation of application No. 10/965,601, filed on Oct. 13, 2004, now abandoned.

(51) Int. Cl.
*H05B 3/00* (2006.01)
(52) U.S. Cl. ................ 29/611; 29/509; 29/515; 29/850; 29/868
(58) Field of Classification Search .................... 29/611, 29/850, 868, 509, 515, 520, 521; 219/444.1, 219/465.1, 468.1, 530, 535, 540, 544
See application file for complete search history.

(56) References Cited

U.S. PATENT DOCUMENTS

| | | | |
|---|---|---|---|
| 1,969,760 A | 8/1934 | Reynolds | |
| 2,222,192 A | 11/1940 | Arnold et al. | |
| 2,389,588 A | 11/1945 | Woodman | |
| 2,541,118 A | 2/1951 | Sparklin et al. | |
| 2,875,312 A | 2/1959 | Norton | |
| 5,104,459 A | 4/1992 | Chen et al. | |
| 5,422,459 A | 6/1995 | Zhou | |
| 5,844,205 A | 12/1998 | White et al. | |
| 5,963,840 A | 10/1999 | Xia et al. | |
| 6,035,101 A | 3/2000 | Sajoto et al. | |
| 6,087,632 A | 7/2000 | Mizosaki et al. | |
| 6,147,334 A | 11/2000 | Hannigan | |
| 6,180,931 B1 | 1/2001 | Futakuchiya et al. | |
| 6,348,099 B1 | 2/2002 | Xia et al. | |
| 6,371,357 B1 | 4/2002 | Watanabe | |
| 6,376,815 B1 | 4/2002 | Watanabe | |
| 6,477,980 B1 | 11/2002 | White et al. | |
| 6,500,356 B2 | 12/2002 | Goto et al. | |
| 6,506,291 B2 | 1/2003 | Tsai et al. | |
| 6,552,311 B2 | 4/2003 | Watanabe | |
| 6,557,747 B2 | 5/2003 | Watanabe | |
| 6,660,975 B2 | 12/2003 | Wang et al. | |
| 6,897,411 B2 | 5/2005 | Beer et al. | |
| 7,154,070 B2 | 12/2006 | Watanabe et al. | |
| 2003/0098300 A1 | 5/2003 | Shin | |

FOREIGN PATENT DOCUMENTS

KR 1020040075178 8/2004
TW 438903 6/2001

OTHER PUBLICATIONS

Office Action dated Jul. 17, 2007 from Taiwanese Patent Office on Application No. 94128097.

*Primary Examiner* — Thiem Phan
(74) *Attorney, Agent, or Firm* — Patterson & Sheridan, L.L.P.

(57) ABSTRACT

A method of forming a substrate support comprises providing a body having a groove, inserting a heater element into the groove, disposing an insert into the groove, and inserting a cap into the groove. The heater element comprises a resistive element inside a sheath encased in a malleable cladding. The insert is disposed over the cladding, and the cap is substantially flush with an outer surface of the body.

24 Claims, 4 Drawing Sheets

METHOD OF FABRICATING A HEATED SUBSTRATE SUPPORT

CROSS-REFERENCE TO RELATED APPLICATIONS

This application is a continuation of U.S. patent application Ser. No. 10/965,601, filed Oct. 13, 2004 now abandoned, which the aforementioned related patent application is herein incorporated by reference.

BACKGROUND OF THE INVENTION

1. Field of the Invention

Embodiments of the invention generally provide a substrate support utilized in substrate processing and a method of fabricating the same.

2. Description of the Related Art

Liquid crystal displays or flat panels are commonly used for active matrix displays such as computer and television monitors. Generally, flat panels comprise two glass plates having a layer of liquid crystal material sandwiched therebetween. At least one of the glass plates includes at least one conductive film disposed thereon that is coupled to a power supply. Power supplied to the conductive film from the power supply changes the orientation of the crystal material, creating a pattern such as text or graphics that can be seen on the display. One fabrication process frequently used to produce flat panels is plasma enhanced chemical vapor deposition (PECVD).

Plasma enhanced chemical vapor deposition is generally employed to deposit thin films on a substrate such as a silicon or quartz wafer, large area glass or polymer workpiece, and the like. Plasma enhanced chemical vapor deposition is generally accomplished by introducing a precursor gas into a vacuum chamber that contains the substrate. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of the substrate that is positioned on a temperature controlled substrate support. In applications where the substrate receives a layer of low temperature polysilicon, the substrate support may be heated in excess of 400 degrees Celsius. Volatile by-products produced during the reaction are pumped from the chamber through an exhaust system.

Generally, the substrate support utilized to process flat panel displays are large, most often exceeding 550 mm×650 mm. The substrate supports for high temperature use are typically forged or welded, encapsulating one or more heating elements and thermocouples in an aluminum body. The substrate supports typically operate at elevated temperatures (i.e., in excess of 350 degrees Celsius and approaching 500 degrees Celsius). Due to these high operating temperatures, the heating elements encapsulated in the substrate supports are susceptible to failure due to local hot spots that may form if the heat is not properly carried away and distributed throughout the substrate support.

Although substrate supports configured in this manner have demonstrated good processing performance, manufacturing such supports has proven difficult and expensive. Moreover, as the cost of materials and manufacturing the substrate support is great, failure of the substrate support is highly undesirable. Additionally, if the substrate support fails during processing, a substrate supported thereon may be damaged. As this may occur after a substantial number of processing steps have been preformed thereon, the resulting loss of the in-process substrate may be very expensive. Furthermore, replacing a damaged support in the process chamber creates a costly loss of substrate throughput while the process chamber is idled during replacement or repair of the substrate support. Moreover, as the size of the next generation substrate supports are increased to accommodate substrates in excess of 2 square meters at operating temperatures approaching 500 degrees Celsius, the aforementioned problems become increasingly more important to resolve.

Therefore, there is a need for an improved substrate support.

SUMMARY OF THE INVENTION

Embodiments of a heated substrate support are provided herein. In one embodiment, the substrate support includes a body having a support surface and at least one groove. A heater element clad with a malleable heat sink is disposed in the groove. Substantially no air is trapped between the clad heater element and the groove. An insert is disposed in the groove above the heater element. The insert substantially covers and contacts the clad heater element and the sides of the groove. A cap is disposed in the groove above the insert. The cap covers and contacts the insert and has an upper surface disposed substantially flush with the support surface.

In another embodiment, a method of forming a substrate support is provided. The method of forming the substrate support includes the steps of providing a body having at least one groove formed in an upper support surface thereof and cladding a heater element with a material softer than the body, the material adapted to be a heat sink. The clad heater element is inserted into the groove. At least a bottom portion of the groove has a diameter which lies between the diameter of the clad heater element and the diameter of the unclad heater element. An insert is disposed in the groove over the clad heater element and a cap is inserted into the groove over the insert. An upper surface of the cap is disposed substantially flush with the upper support surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The invention generally provides a heated substrate support and methods of fabricating the same. The invention is illustratively described below in reference to a PECVD system, such as a PECVD system available from AKT, a division of Applied Materials, Inc., located in Santa Clara, Calif. However, it should be understood that the invention has utility in other system configurations such as physical vapor deposition systems, ion implant systems, etch systems, other chemical vapor deposition systems and other systems in which use of a heated substrate support is desired.

Figure 1:
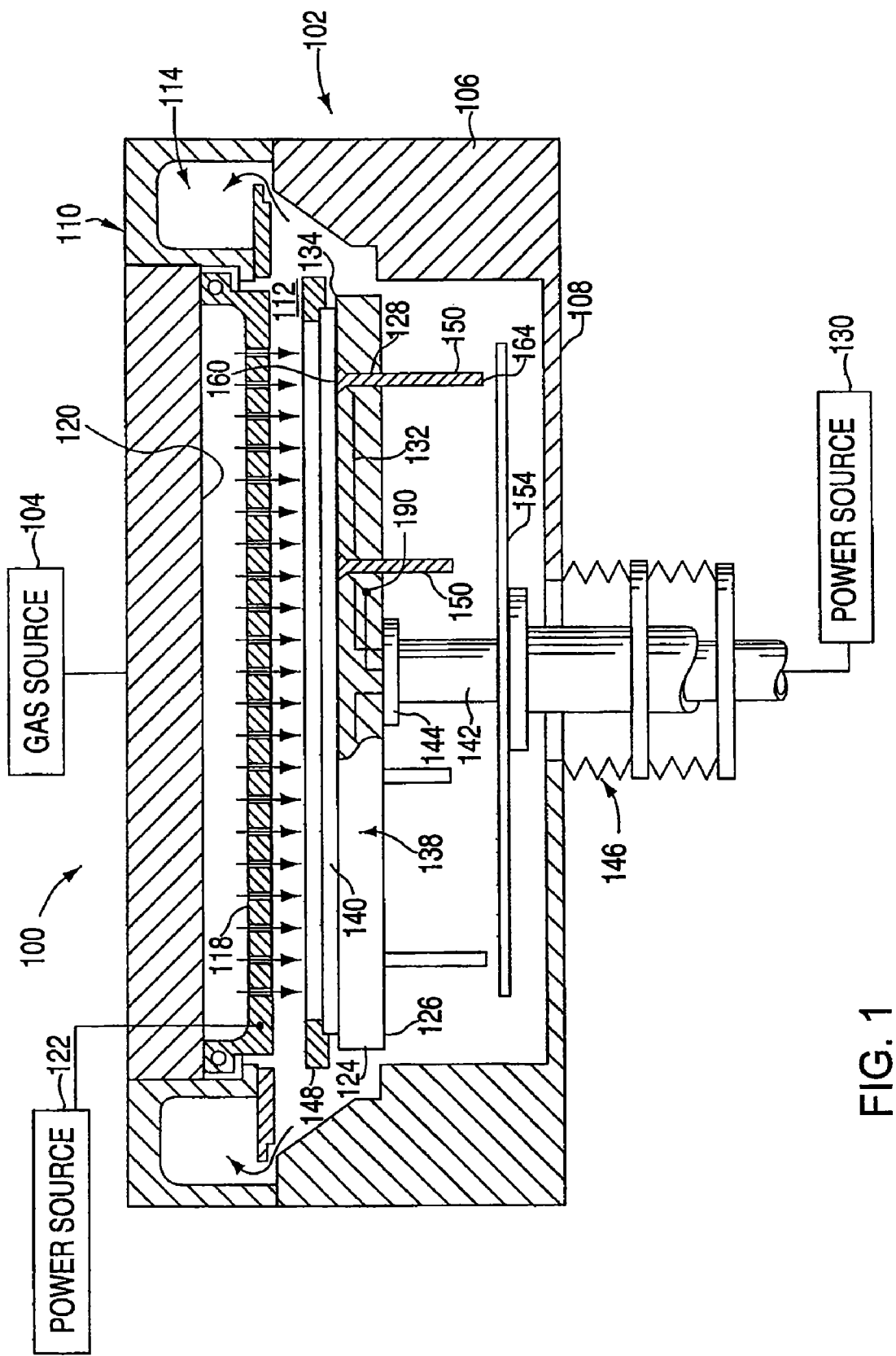
FIG. 1 is a schematic sectional view of one embodiment of a processing chamber having a substrate support of the present invention.

FIG. 1 is a cross sectional view of one embodiment of a plasma enhanced chemical vapor deposition system 100. The system 100 generally includes a chamber 102 coupled to a gas source 104. The chamber 102 has walls 106, a bottom 108, and a lid assembly 110 that define a process volume 112. The process volume 112 is typically accessed through a port (not shown) in the walls 106 that facilitates movement of the substrate 140 into and out of the chamber 102. The walls 106 and bottom 108 are typically fabricated from a unitary block of aluminum or other material compatible for processing. The lid assembly 110 contains a pumping plenum 114 that couples the process volume 112 to an exhaust port (that includes various pumping components, not shown).

The lid assembly 110 is supported by the walls 106 and can be removed to service the chamber 102. The lid assembly 110 is generally comprised of aluminum. A distribution plate 118 is coupled to an interior side 120 of the lid assembly 110. The distribution plate 118 is typically fabricated from aluminum. The center section includes a perforated area through which process and other gases supplied from the gas source 104 are delivered to the process volume 112. The perforated area of the distribution plate 118 is configured to provide uniform distribution of gases passing through the distribution plate 118 into the chamber 102.

A heated substrate support assembly 138 is centrally disposed within the chamber 102. The support assembly 138 supports a substrate 140 during processing. In one embodiment, the substrate support assembly 138 comprises an aluminum body 124 that encapsulates at least one embedded heating element 132 and a thermocouple 190. The body 124 may optionally be coated or anodized. Alternatively, the body 124 may be made of ceramics or other materials compatible with the processing environment.

The heating element 132, such as an electrode disposed in the support assembly 138, is coupled to a power source 130 and controllably heats the support assembly 138 and substrate 140 positioned thereon to a predetermined temperature. Typically, the heating element 132 maintains the substrate 140 at a uniform temperature of from about 150 to at least about 460 degrees Celsius.

Generally, the support assembly 138 has a lower side 126 and an upper surface 134 that supports the substrate. In one embodiment, the upper support surface 134 is configured to support a substrate greater than or equal to about 550 by about 650 millimeters. In one embodiment, the upper support surface 134 has a plan area greater than or equal to about 0.35 square meters for supporting substrates having a size greater than or equal to about 550 by 650 millimeters. In one embodiment, the upper support surface 134 has a plan area of greater than or equal to about 2.7 square meters (for supporting substrates having a size greater than or equal to about 1500 by 1800 millimeters). The upper support surface 134 may generally have any shape or configuration. In one embodiment, the upper support surface 134 has a substantially polygonal shape. In one embodiment, the upper support surface is a quadrilateral.

The lower side 126 has a stem cover 144 coupled thereto. The stem cover 144 generally is an aluminum ring coupled to the support assembly 138 that provides a mounting surface for the attachment of a stem 142 thereto. Generally, the stem 142 extends from the stem cover 144 and couples the support assembly 138 to a lift system (not shown) that moves the support assembly 138 between an elevated position (as shown) and a lowered position. A bellows 146 provides a vacuum seal between the chamber volume 112 and the atmosphere outside the chamber 102 while facilitating the movement of the support assembly 138. The stem 142 additionally provides a conduit for electrical and thermocouple leads between the support assembly 138 and other components of the system 100.

The support assembly 138 has a plurality of holes 128 disposed therethrough that accept a plurality of lift pins 150. The lift pins 150 are typically comprised of ceramic or anodized aluminum. Generally, the lift pins 150 have first ends 160 that are substantially flush with or slightly recessed from an upper surface 134 of the support assembly 138 when the lift pins 150 are in a normal position (i.e., retracted relative to the support assembly 138). The first ends 160 are generally flared to prevent the lift pins 150 from falling through the holes 128. A second end 164 of the lift pins 150 extends beyond the lower side 126 of the support assembly 138. The lift pins 150 may be displaced relative to the support assembly 138 by a lift plate 154 to project from the support surface 134, thereby placing the substrate in a spaced-apart relation to the support assembly 138.

The support assembly 138 generally is grounded such that RF power supplied by a power source 122 to the distribution plate 118 (or other electrode positioned within or near the lid assembly of the chamber) may excite the gases disposed in the process volume 112 between the support assembly 138 and the distribution plate 118. The RF power from the power source 122 is generally selected commensurate with the size of the substrate to drive the chemical vapor deposition process.

The support assembly 138 additionally supports a circumscribing shadow frame 148. Generally, the shadow frame 148 prevents deposition at the edge of the substrate 140 and support assembly 138 so that the substrate does not stick to the support assembly 138.

Figure 2:
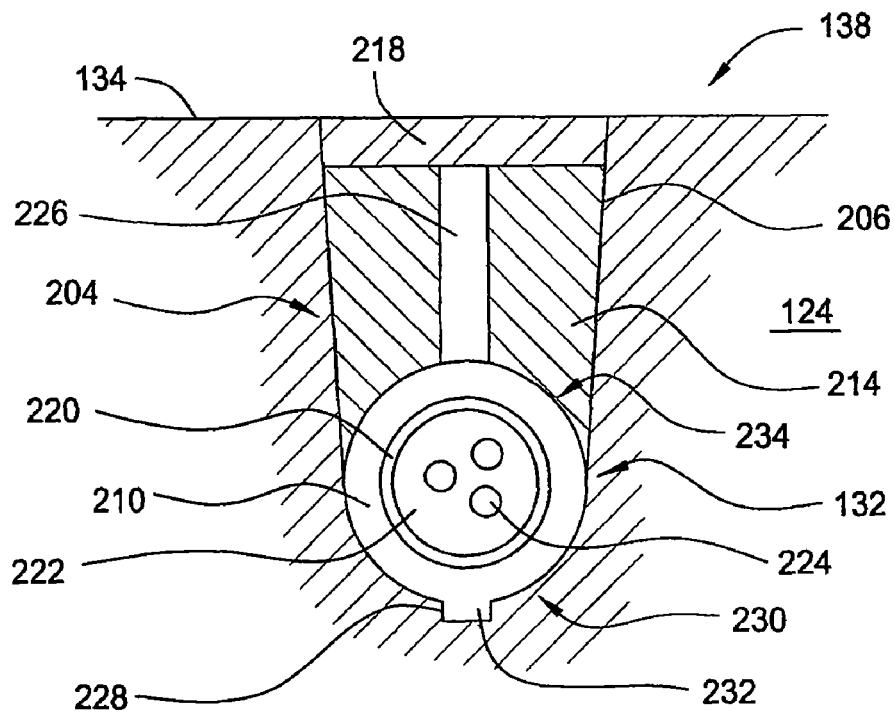
FIG. 2 is a partial cross-sectional view of one embodiment of the substrate support assembly of FIG. 1.

FIG. 2 depicts a partial cross-sectional view of the heater element 132 disposed in a groove 204 formed in the substrate support assembly 138. The heater element 132 generally includes a plurality of conductive elements 224 encased in a dielectric 222 and covered with a protective sheath 220. The heater element 132 further includes a cladding 210 which surrounds the sheath 220. The cladding 210 forms an integral bond with the sheath 220, having substantially no air pockets trapped between the cladding 210 and the sheath 220. In one embodiment, the heater element 132 may be clad by tightly wrapping a conformable sheet of the cladding 210 around the sheath 220. Alternatively, the cladding 210 may be formed of a larger diameter tubing than the sheath 220, which is then drawn through a die and swaged around the sheath 220 of the heater element 132. It is contemplated that the heater element 132 may also comprise a conduit (not shown) for flowing a heat transfer fluid therethrough having the cladding 210 circumscribing the conduit.

Generally, the cladding 210 has good thermal conductivity and is thick enough to be a heat sink at high heating rates to substantially prevent hot spots on the heater element 132 during operation. As such, the cladding 210 generally may comprise any material with high thermal conductivity such that the cladding 210 is a sink for the heat produced by the conductive elements 224 during operation. The thickness of the cladding 210 required for a given application may be computed based upon the required heat load of the heater element 132. The cladding 210 is also generally softer, or more malleable, than the body 124 of the substrate support assembly 138 to prevent deformation of the groove 204 upon insertion of the heater element 132. In one embodiment, the cladding 210 may be made from a high purity, super plastic aluminum material, such as aluminum 1100 up to about aluminum 3000-100 series. The cladding 210 may be fully annealed. In one embodiment, the cladding 210 is formed from aluminum 1100-O. In another embodiment, the cladding 210 is formed from aluminum 3004.

The heater element 132 is disposed in the groove 204, or multiple grooves, formed in an upper surface 134 of the substrate support assembly 138. Alternatively, the grooves 204 for receiving the heater element 132 may be formed in the lower side 126 of the substrate support. The groove 204 has walls 206 and a bottom 230 that are generally not held to tight tolerances during fabrication. The groove 204 may be formed in the body 124 of the substrate support assembly 138 in any number, size, or pattern as required to produce a desired heat distribution profile utilizing the heater element 132. The groove 204 is generally deep enough such that the heater element 132 is positioned in a desired location upon insertion into the groove 204 and the depth may vary depending upon the application. In one embodiment, the depth of the groove 204 is calculated such that the heater element 132 is substantially centered in the body 124 of the substrate support assembly 138.

Figure 4:
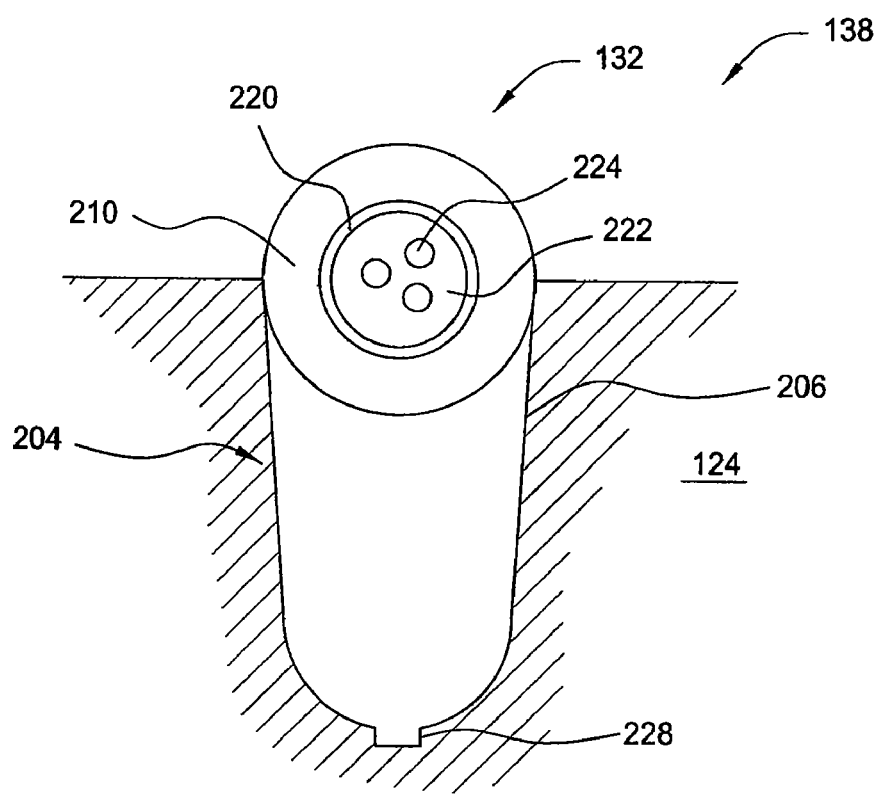
FIGS. 4-7 are partial cross-sectional views of a substrate support assembly in varying stages of fabrication as described by the method of FIG. 3.

In one embodiment, the groove 204 is wider in diameter than the sheath 220 of the heater element 132 but narrower than the diameter of the cladding 210 prior to insertion, as depicted in FIG. 4. The heater element 132 is press-fit into the groove 204 such that the malleable cladding 210 deforms upon insertion into the groove 204 and disrupt the native oxide layers, thereby providing integral contact between the heater element 132 and the groove 204. As the groove 204 is wider than the diameter of the sheath 220, the conductive elements 224 and the dielectric 222 will remain undamaged by the insertion of the heater element 132 into the groove 204.

The walls 206 of the groove 204 may be substantially straight and parallel. Optionally, the walls 206 of the groove 204 may be formed at a slight angle or taper, such that the bottom 230 of the groove 204 is slightly narrower than the top portion of the groove 204. The angle of taper between the walls 206 is generally less than 3 degrees, although larger taper angles are also contemplated. The tapered walls 206 advantageously allows for easier insertion of the heater element 132, while still being narrow enough proximate the bottom 230 of the groove 204 to work the cladding 210 and the body 124 to form integral contact therebetween.

The bottom 230 of the groove 204 may be radiused to conform with the shape of the heater element 132. Alternatively, or in combination, the bottom 230 of the groove 204 may be roughened, or textured, to facilitate forming a more tightly interlocking seal or bond between the cladding 210 of the heater element 132 and the body 124 of the substrate support assembly 138. The textured surface further prevents movement between the heater element 132 and the body 124 of the substrate support assembly 138.

A channel 228 may also be provided in the bottom 230 of the groove 204. The channel 228 allows air to escape during insertion of the heating element 132 and further interlocks the heater element 132 and the groove 204. Upon insertion of the heater element 132 in the groove 204, a portion 232 of the cladding 210 deforms to fill the channel 228 to be in complete, integral contact with the body 124 of the substrate support assembly 138. Substantially no air pockets remain trapped between the cladding 210 and the groove 204, further enhancing heat transfer from the heater element 138 to the body 124 of the substrate support assembly 138. Optionally, prior to inserting the heater element 132, the groove 204 may be cleaned to remove any native oxide that may be present on the exposed surfaces of the groove 204. For example, the oxide layer may be abraded, etched with a caustic material, or removed by coating the exposed surfaces of the groove 204 with a sub-micron thick inhibitor layer prior to insertion of the heater element 132.

Figure 6:
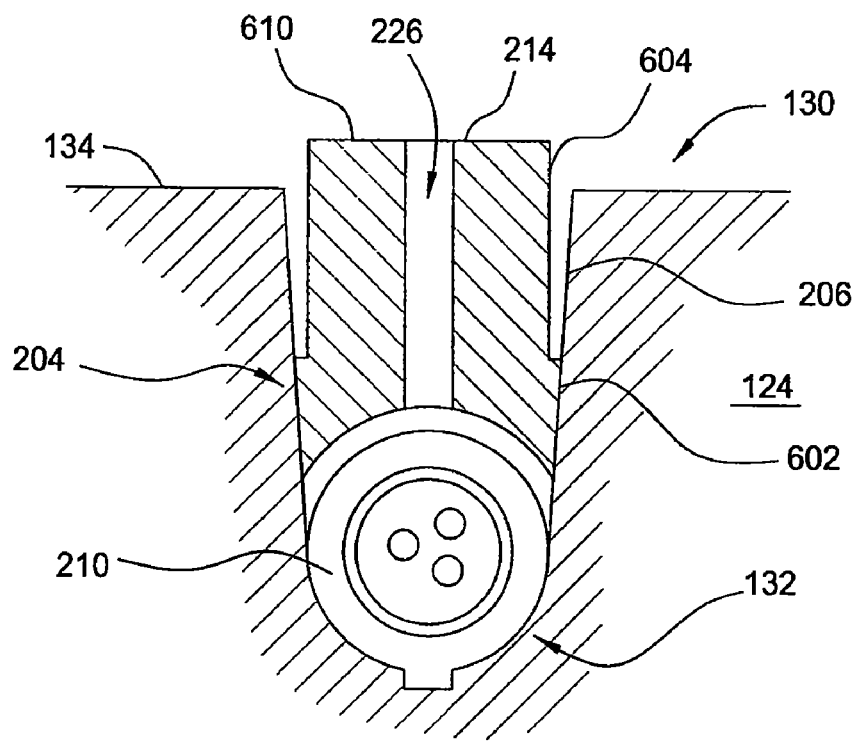
Figure 7:
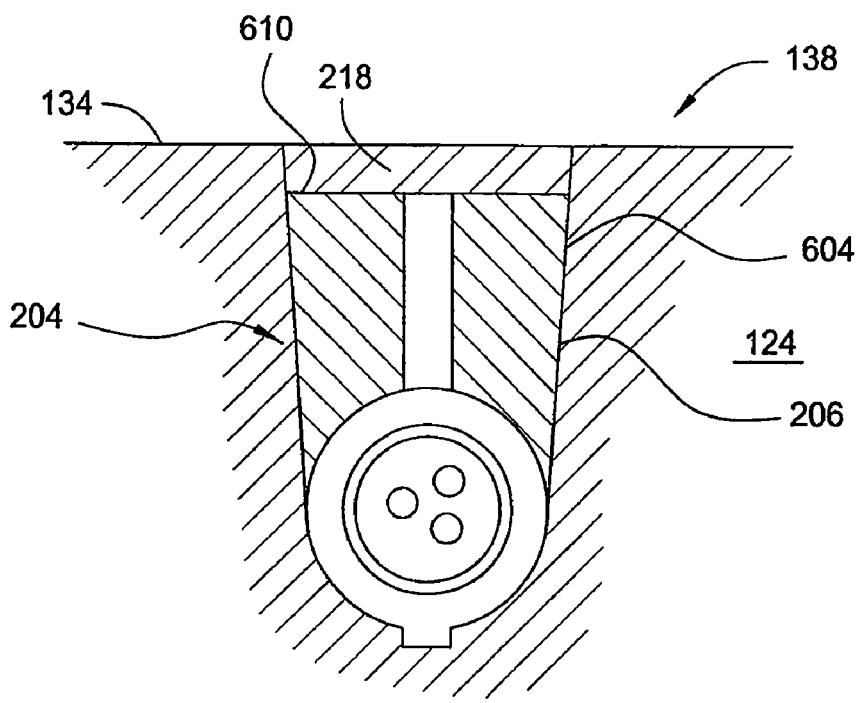

An insert 214 is disposed in the groove 204 above the heater element 132 and in close contact with the cladding 210 and the body 124 of the substrate support assembly 138. The insert 214 is generally made of the same materials as the cladding 210 and further improves the heat transfer away from the heater element 132. A bottom portion 234 of the insert 214 may be curved or otherwise shaped to conform more uniformly with the upper surface of the cladding 210 of the heating element 132. A plurality of air escape holes 226 may be formed in the insert 214 to allow air to escape from between the bottom portion 234 of the insert 214 and the heating element 132 during fabrication to further ensure integral contact between the insert 214 and the cladding 210 of the heating element 132. In one embodiment, as depicted in FIG. 6, the insert 214 has a lower portion 602 in contact with the walls 206 of the groove 204 and an upper portion 604 which is slightly relieved and not in contact with the walls 206. For example, the upper portion 604 may be relieved by several thousands of an inch. The reduced surface contact between the insert 214 and the walls 206 of the groove 204 facilitates easier insertion of the insert 214 into the groove 204. The relief is removed when the insert 214 is peened, rolled, pressed, or forged into the groove 204. The softness of the material of the insert 214 allows this process to occur without substantial yielding of the material of the body 124. After insertion into the groove 204, the insert 214 may be machined back to provide a true surface for a cap 218 that covers the insert 214.

The cap 218 covers the insert 214 and is disposed substantially flush with the upper surface 134 of the substrate support assembly 138. The cap 218 may comprise the same materials as the body 124 and is generally affixed to the walls 206 of the groove 204 to secure it in place. In one embodiment, the cap 218 may be welded to the body 124. Alternatively, the cap 218 may be forged in place. It is contemplated that other methods of affixation of the cap 218 to the body 124 of the substrate support assembly 138 may be utilized equally as well as long as the union between the cap 218 and body 124 can withstand the processing conditions that the substrate support assembly 138 is subjected to. Optionally, the cap 218 and/or the body 124 may be machined coplanar to provide a smooth upper surface 134 for supporting a substrate thereon. The substrate support assembly 138 may also be machined on the lower side 126 to balance the heat distribution from the embedded heater element 132.

Figure 3:
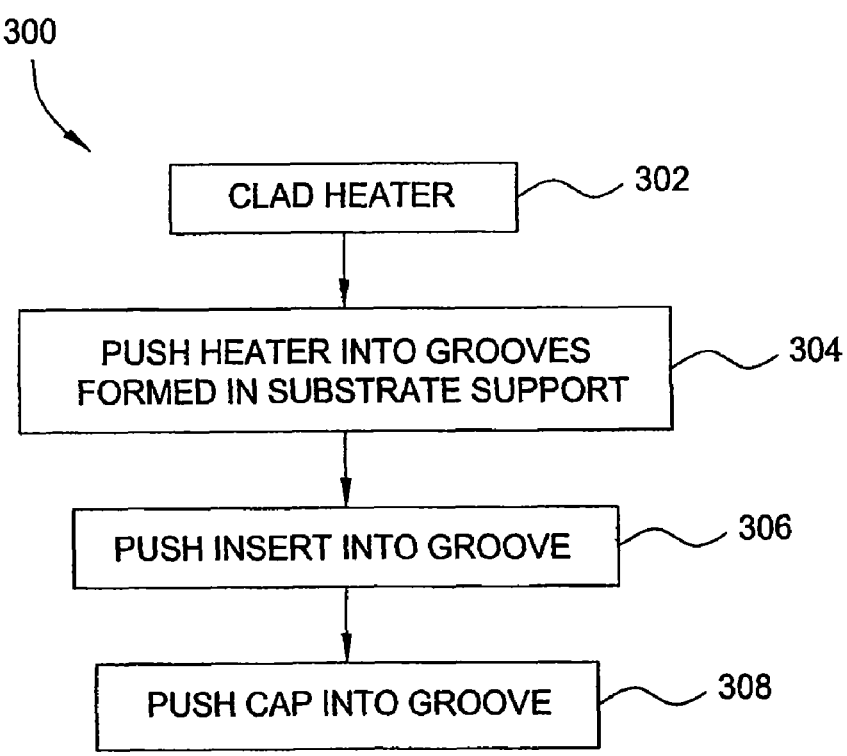
FIG. 3 is a flow chart depicting an inventive method for fabricating a substrate support.
Figure 5:
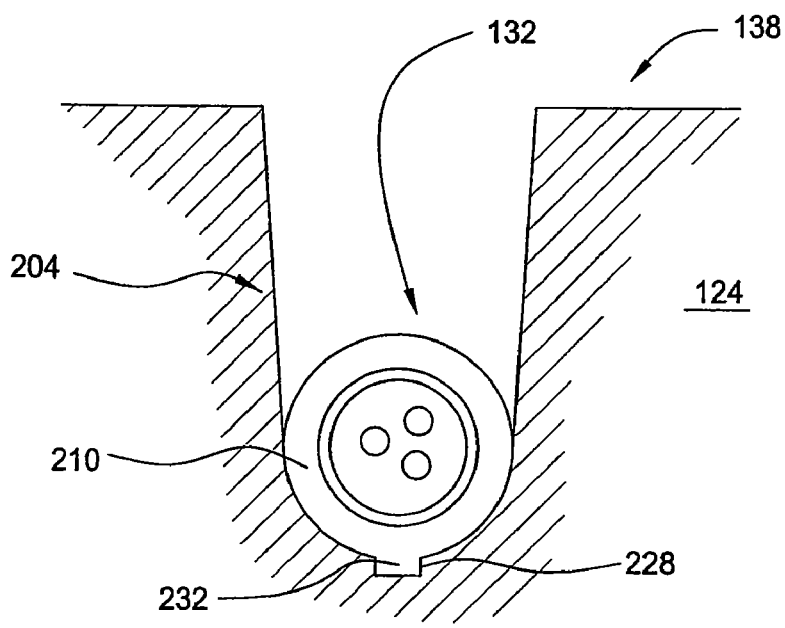

FIG. 3 is a flow chart of one embodiment of a method 300 of fabricating a substrate support assembly as described above. The method depicted in FIG. 3 is further illustrated with reference to FIGS. 4-7. The method 300 includes a step 302, wherein a heater element 132 is encased with a cladding 210. At step 304, the heater element 132 is inserted into a groove 204 formed in the substrate support assembly 138. The heater element 132 may be forced into the groove 204 by, for example, a mechanical or hydraulic press. It is contemplated that other means may be utilized to insert the clad heater element 132 into the groove 204. As shown in FIG. 4, the groove 204 is generally slightly narrower than the diameter of the heating element 132 due to the thickness of the cladding 210. The malleable cladding 210 will deform upon the forced insertion into the groove 204. This advantageously allows for substantially complete contact between the cladding 210 and the groove 204, as shown in FIG. 5. As also depicted in FIG. 5, in one embodiment, a portion 232 of the cladding 210 will be forced into the channel 228 formed in the groove 204.

Next, at step 306, an insert 214 is inserted into the groove 204 to cover the heating element 132, as depicted in FIG. 6. The insert 214 substantially fills the remainder of the groove 204 not occupied by the heating element 132. The insert 214 may generally be press-fit into the groove 204 by the same methods used in step 304 to insert the heater element 132. Upon installation of the insert 214, there may be a net positive force on the heater element 132. As shown in the embodiment depicted in FIG. 6, an upper surface 610 of the insert 214 remains slightly higher than the upper surface 134 of the substrate support assembly 138 at the end of step 306.

Finally, at step 308, a cap 218 (depicted in FIG. 7) is inserted into the groove 204. The cap 218 may be inserted into the groove by the same means used above in steps 304 and 308. The cap 218 compresses the insert 214 to apply a net positive force against the heating element 132. Upon compression of the insert 214, the relieved portion 604 of the insert 214 expands to come into contact with the wall 206 of the groove 204. The amount of relief provided to the upper portion 604 of the insert 214 and the extent to which the upper surface 610 of the insert 214 extends above the upper surface 134 of the substrate support assembly 138 may be calculated based upon the amount of compression and deformation which will occur upon inserting the cap 218 completely into the groove 204 and flush with the upper surface 134 of the substrate support assembly 138. The expansion of the insert 214 should be calculated such that it will fill the groove 204 to insure integral contact between the insert 214 and the wall 206 of the groove 204 while not forcing the groove 204 to open up, widen, or otherwise deform.

The step 308 of inserting the cap 218 into the groove 204 is completed by affixing the cap 218 to the body 124 of the substrate support assembly 138. Optionally, the upper surface 134 of the substrate support assembly and the cap 218 may be machined to improve the upper surface 134 for supporting a substrate thereon.

While the foregoing is directed to embodiments of the present invention, other and further embodiments of the invention may be devised without departing from the basic scope thereof, and the scope thereof is determined by the claims that follow.

The invention claimed is:

1. A method of forming a substrate support, comprising:
providing a body having at least one groove formed in a surface thereof;
inserting a heater element into the groove, wherein the heater element comprises at least one resistive element encased in an insulating material and covered with a sheath, wherein the sheath is encased in a cladding with substantially no air pockets trapped between the cladding and the sheath, wherein the cladding comprises a thickness sufficient to prevent hot spots on the heater element, wherein the cladding is formed from a thermally conductive material that is more malleable than the body such that the cladding deforms upon insertion in the groove to prevent deformation of the body and to allow substantially complete contact between the cladding and the body;
disposing an insert into the groove over the cladding; and
inserting a cap into the groove, wherein an outer surface of the cap is disposed substantially flush with an outer surface of the body.

2. The method of claim 1, wherein the cladding comprises an aluminum alloy.

3. The method of claim 1, wherein the groove is wider than the sheath and narrower than the cladding prior to insertion.

4. The method of claim 1, wherein walls forming the groove in the body are tapered so that a bottom portion of the groove is narrower than a top portion of the groove to allow for easier insertion of the heater element into the groove.

5. The method of claim 1, wherein a bottom surface of the groove is textured to facilitate formation of a bond between the cladding and the groove.

6. The method of claim 1, wherein the groove has a channel to allow air to escape during insertion of the heater element into the groove.

7. The method of claim 6, wherein a portion of the cladding deforms to fill the channel upon insertion of the heater element into the groove.

8. The method of claim 1, further comprising disrupting a native oxide layer from a surface of the groove upon insertion of the heater element using the cladding.

9. The method of claim 1, wherein an upper surface of the insert remains higher than an upper surface of the groove after insertion of the insert into the groove and prior to insertion of the cap into the groove.

10. The method of claim 1, wherein the insert has a lower portion in contact with walls of the groove and an upper portion having a relief that is not in contact with the walls of the groove.

11. The method of claim 10, further comprising pressing the insert into the groove, thereby removing the relief so that the upper portion contacts the walls of the groove.

12. The method of claim 1, further comprising compressing the insert using the cap, thereby applying a net positive force against the heating element.

13. The method of claim 1, further comprising welding the cap to the body.

14. The method of claim 1, further comprising:
cladding the sheath of the heater element so that air between the cladding and the sheath is removed to form an integral bond between the sheath and the cladding, wherein the cladding is formed from a material that is softer than the body such that the cladding deforms upon insertion into the groove to prevent deformation of the groove and to allow substantially complete contact between the cladding and the groove.

15. The method of claim 14, wherein the groove is defined by walls of the body that taper outwardly from a bottom of the groove to the surface, and wherein the walls form an enclosed angle less than about three degrees.

16. The method of claim 14, wherein at least a bottom portion of the groove has a diameter between the diameter of the cladding prior to insertion into the groove and the diameter of the heater element.

17. The method of claim 14, wherein the cladding the heater element further comprises wrapping a conformable sheet of cladding material around the heater element.

18. The method of claim 14, wherein the cladding the heater element further comprises drawing a tubing of the cladding material having a larger diameter than the heater element through a die and swaging the tubing around the heater element.

19. The method of claim 14, wherein the cladding the heater element further comprises annealing the cladding material.

20. The method of claim 14, further comprising press-fitting the cladding into the groove.

21. The method of claim 14, further comprising venting gas from between the heater element and the body through a channel provided proximate a bottom of the groove.

22. The method of claim 14, further comprising venting gas from between the cladding and the insert through a plurality of holes formed through the insert.

23. The method of claim 14, further comprising forming a seal between the heater element and an atmosphere outside of the body.

24. The method of claim 1, wherein the insulating material is a dielectric material.

* * * * *